(12) United States Patent
Choi et al.

(10) Patent No.: US 10,446,525 B2
(45) Date of Patent: Oct. 15, 2019

(54) SEMICONDUCTOR PACKAGE

(71) Applicant: Samsung Electronics Co., Ltd., Suwon-si, Gyeonggi-do (KR)

(72) Inventors: Yong-won Choi, Hwaseong-si (KR); Won-keun Kim, Hwaseong-si (KR); Myung-sung Kang, Yongin-si (KR); Gwang-sun Seo, Jeonju-si (KR)

(73) Assignee: Samsung Electronic Co., Ltd. (KR)

( * ) Notice: Subject to any disclaimer, the term of this patent is extended or adjusted under 35 U.S.C. 154(b) by 0 days.

(21) Appl. No.: 16/050,341

(22) Filed: Jul. 31, 2018

(65) Prior Publication Data

US 2018/0350779 A1   Dec. 6, 2018

Related U.S. Application Data

(63) Continuation of application No. 15/435,286, filed on Feb. 16, 2017, now Pat. No. 10,043,780.

(30) Foreign Application Priority Data

Jul. 6, 2016   (KR) .................. 10-2016-0085595

(51) Int. Cl.
| | |
|---|---|
| *H01L 23/52* | (2006.01) |
| *H01L 25/065* | (2006.01) |
| *H01L 21/56* | (2006.01) |

(52) U.S. Cl.
CPC ........ *H01L 25/0657* (2013.01); *H01L 21/563* (2013.01); *H01L 2224/16145* (2013.01); *H01L 2224/73204* (2013.01); *H01L 2225/06513* (2013.01); *H01L 2225/06517* (2013.01); *H01L 2225/06541* (2013.01); *H01L 2225/06586* (2013.01); *H01L 2225/06589* (2013.01)

(58) Field of Classification Search
CPC ....... H01L 25/0657; H01L 2225/06517; H01L 2225/06513; H01L 2225/06541
USPC ......................................... 257/774
See application file for complete search history.

(56) References Cited

U.S. PATENT DOCUMENTS

| | | | |
|---|---|---|---|
| 7,598,617 B2 * | 10/2009 | Lee | ........................ H01L 23/481 257/678 |
| 8,349,649 B2 | 1/2013 | Kurita | |
| 9,147,813 B2 | 9/2015 | Ng et al. | |
| 9,368,374 B2 | 6/2016 | Hamazaki et al. | |
| 2009/0029504 A1 | 1/2009 | Paik et al. | |
| 2010/0290205 A1 | 11/2010 | Suga | |
| 2011/0237028 A1 | 9/2011 | Hamazaki et al. | |
| 2012/0038045 A1 * | 2/2012 | Lee | .................... H01L 23/3107 257/738 |
| 2012/0168213 A1 | 7/2012 | Park et al. | |

(Continued)

FOREIGN PATENT DOCUMENTS

| | | |
|---|---|---|
| JP | 2010226098 | 10/2010 |
| KR | 100838647 | 6/2008 |

(Continued)

*Primary Examiner* — Vu A Vu
(74) *Attorney, Agent, or Firm* — Myers Bigel, P.A.

(57) ABSTRACT

A semiconductor package includes a first semiconductor chip including a first through-silicon via (TSV), a second semiconductor chip stacked on the first semiconductor chip and including a second TSV, and a non-conductive film formed between the first semiconductor chip and the second semiconductor chip. The non-conductive film includes two layers having different viscosities.

20 Claims, 18 Drawing Sheets

(56) References Cited

U.S. PATENT DOCUMENTS

| | | |
|---|---|---|
| 2012/0189818 A1 | 7/2012 | Hayashi |
| 2012/0193812 A1 | 8/2012 | Toh et al. |
| 2013/0027895 A1 | 1/2013 | Hayashi |
| 2013/0234325 A1 | 9/2013 | Dai et al. |
| 2014/0021978 A1* | 1/2014 | Ikeda ................ G01R 31/2889 324/762.06 |
| 2014/0339692 A1* | 11/2014 | Kim ..................... H01L 23/36 257/713 |
| 2014/0355226 A1 | 12/2014 | Kim et al. |

FOREIGN PATENT DOCUMENTS

| | | |
|---|---|---|
| KR | 20100010694 | 2/2010 |
| KR | 100979349 | 8/2010 |
| KR | 101362868 | 2/2014 |
| KR | 101399957 | 5/2014 |

* cited by examiner

SEMICONDUCTOR PACKAGE

CROSS-REFERENCE TO RELATED APPLICATION

This application is a continuation application of and claims priority from U.S. patent application Ser. No. 15/435,286, filed on Feb. 16, 2017, which claims the benefit of Korean Patent Application No. 10-2016-0085595, filed on Jul. 6, 2016, in the Korean Intellectual Property Office, the entire disclosures of which are hereby incorporated by reference.

BACKGROUND

The inventive concept relates to a semiconductor package, and more particularly, to a semiconductor package including through-silicon vias (TSVs).

With the rapid development of the electronic industry and user demand, electronic devices have been scaled down and become lighter. Also, semiconductor packages used in the electronic devices need not only to be downscaled and lighter but also to be highly efficient and have higher capacity. To this end, continuous research has been conducted into semiconductor chips including TSVs and stacked semiconductor packages.

SUMMARY

According to an aspect of the inventive concept, there is provided a semiconductor package including a first semiconductor chip, a second semiconductor chip, and a non-conductive film. The first semiconductor chip includes a first through-silicon via (TSV). The second semiconductor chip is stacked on the first semiconductor chip and includes a second TSV. The non-conductive film is provided between the first semiconductor chip and the second semiconductor chip and includes two layers having different viscosities.

According to another aspect of the inventive concept, there is provided a semiconductor package including a base substrate, at least two vertically stacked semiconductor chips, and a non-conductive film. The at least two semiconductor chips are mounted on the base substrate. Each of the semiconductor chips includes a TSV. The non-conductive film is provided between the semiconductor chips and includes at least two layers having different viscosities.

A method of forming a semiconductor package, the method comprising: providing a semiconductor wafer having first semiconductor chips each having a first through-silicon via (TSV); forming a non-conductive film on the wafer including the first semiconductor chips, the non-conductive film including at least two layers, each having a different viscosity from each other; and providing second semiconductor chips corresponding to the first semiconductor chips on the non-conductive film, the second semiconductor chips each having a second TSV.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

As used herein, the term "and/or" includes any and all combinations of one or more of the associated listed items. Expressions such as "at least one of," when preceding a list of elements, modify the entire list of elements and do not modify the individual elements of the list.

The inventive concept will now be described more fully hereinafter with reference to the accompanying drawings, in which embodiments are shown.

Figure 1:
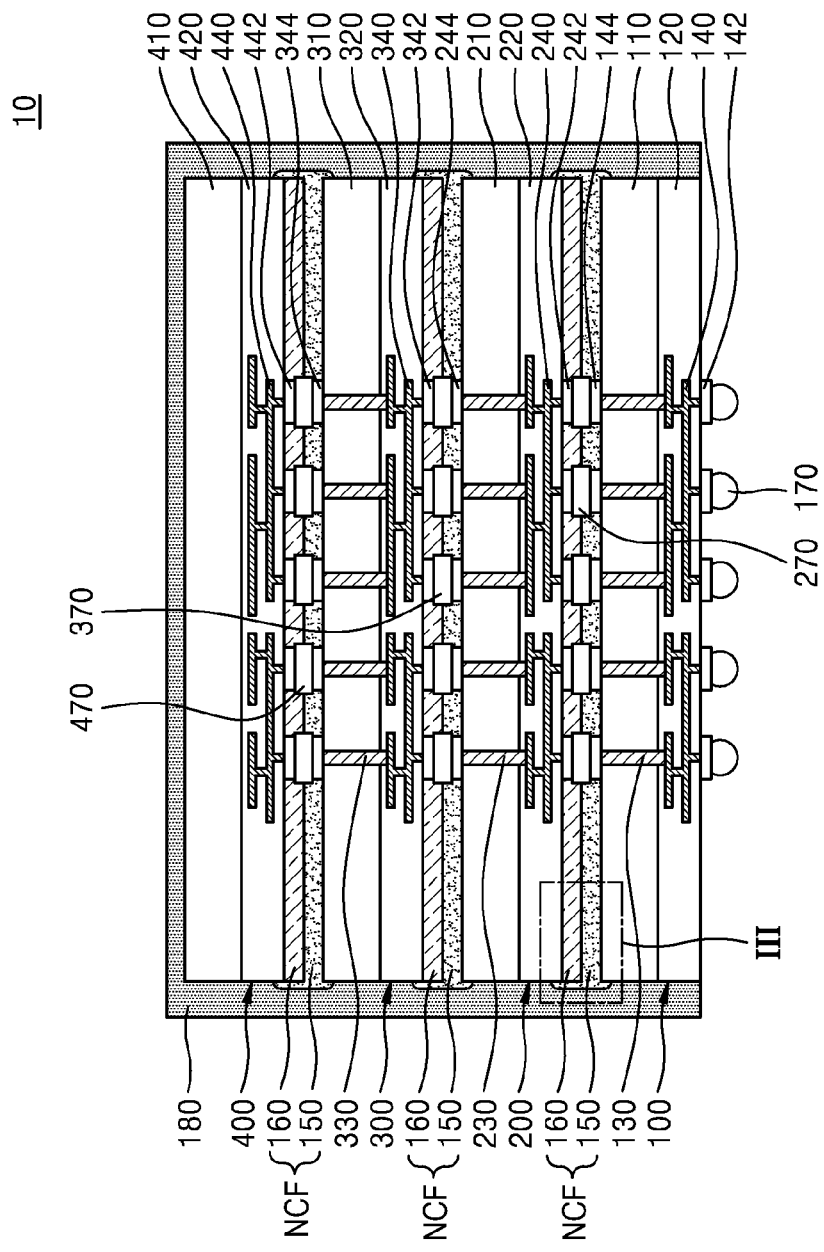
FIG. 1 is a cross-sectional view of a semiconductor package according to an embodiment.

FIG. 1 is a cross-sectional view of a semiconductor package 10 according to an embodiment.

Referring to FIG. 1, the semiconductor package 10 may include a first semiconductor chip 100, a second semiconductor chip 200, a third semiconductor chip 300, and a fourth semiconductor chip 400, which may be sequentially stacked in a vertical direction. The first to fourth semiconductor chips 100, 200, 300, and 400 may be electrically connected to one another or electrically connected to a base substrate (e.g., 600 in FIG. 7) through first to fourth connection bumps 170, 270, 370, and 470. Also, the first to fourth semiconductor chips 100, 200, 300, and 400 may be adhered to one another by, for example, non-conductive films NCF.

The first to fourth semiconductor chips 100, 200, 300, and 400 may be logic chips or memory chips. For example, all of the first to fourth semiconductor chips 100, 200, 300, and 400 may be the same or different types of memory chips. Alternatively, some of the first fourth semiconductor chips 100, 200, 300, and 400 may be memory chips, and some others of the first to fourth semiconductor chips 100, 200, 300, and 400 may be logic chips.

The memory chip may be, for example, a volatile memory chip (e.g., dynamic random access memory (DRAM) or static RAM (SRAM)) or a non-volatile memory chip (e.g., phase-change RAM (PRAM), magneto-resistive RAM (MRAM), ferroelectric RAM (FeRAM), or resistive RAM (RRAM)). In some embodiments, the first to fourth semiconductor chips 100, 200, 300, and 400 may be high-bandwidth memory (HBM) DRAMs. Also, the logic chip may be, for example, a microprocessor (MP), an analog device, or a digital signal processor (DSP).

Although FIG. 1 illustrates an example in which the first to fourth semiconductor chips 100, 200, 300, and 400 are stacked in the semiconductor package 10, the number of semiconductor chips stacked in the semiconductor package 10 is not limited to 4. For example, two, three, five or more semiconductor chips may be stacked in the semiconductor package 10.

The first semiconductor chip 100 may include a first semiconductor substrate 110, a first semiconductor device layer 120, a first TSV 130, a first lower connection pad 142, a first upper connection pad 144, and the first connection bump 170.

The first semiconductor substrate 110 may include a top surface and a bottom surface, opposite to each other. The first semiconductor substrate 110 may include the first semiconductor device layer 120 formed on the bottom surface of the first semiconductor substrate 110. The first TSV 130 may penetrate the first semiconductor substrate 110 and extend from the top surface toward the bottom surface of the first semiconductor substrate 110 and be connected to a first interconnection structure 140 included in the first semiconductor device layer 120. The first lower connection pad 142 may be formed on the first semiconductor device layer 120 and electrically connected to the first TSV 130 through the first interconnection structure 140.

The first semiconductor substrate 110 may include, for example, silicon. Alternatively, the first semiconductor substrate 110 may include a semiconductor element (e.g., germanium) or a compound semiconductor (e.g., silicon carbide (SiC), gallium arsenide (GaAs), indium arsenide (InAs), and indium phosphide (InP)). Alternatively, the first semiconductor substrate 110 may have a silicon-on-insulator (SOI) structure. For example, the first semiconductor substrate 110 may include a buried oxide (BOX) layer. The first semiconductor substrate 110 may include a conductive region, for example, a doped well or a doped structure. Also, the first semiconductor substrate 110 may have various isolation structures, such as a shallow trench isolation (STI) structure.

The first semiconductor device layer 120 may include the first interconnection structure 140 configured to connect a plurality of discrete devices with other interconnections formed on the first semiconductor substrate 110. The first interconnection structure 140 may include a conductive interconnection layer such as a metal interconnection layer and a via plug. For example, the first interconnection structure 140 may have a multi-layered structure formed by alternately stacking at least two metal interconnection layers or at least two via plugs.

The first TSV 130 may extend from the top surface toward the bottom surface of the first semiconductor substrate 110 and extend into the first semiconductor device layer 120. At least a portion of the first TSV 130 may have a pillar shape.

The first lower connection pad 142 may be located on the first semiconductor device layer 120 and electrically connected to the first interconnection structure 140 included in the first semiconductor device layer 120. The first lower connection pad 142 may be electrically connected to the first TSV 130 through the first interconnection structure 140. The first lower connection pad 142 may include at least one of aluminum, copper, nickel, tungsten, platinum, and gold.

Although not shown, a lower passivation layer may be formed on the first semiconductor device layer 120 to protect the first interconnection structure 140 included in the first semiconductor layer 120 and other structures located under the first interconnection structure 140 from an external environment. The lower passivation layer may expose at least a portion of a top surface of the first lower connection pad 142.

The first upper connection pad 144 may be formed on the top surface of the first semiconductor substrate 110 and electrically connected to the first TSV 130. The first upper connection pad 144 may include the same material as the first lower connection pad 142. Also, although not shown, an upper passivation layer may be formed on the top surface of the first semiconductor substrate 110 and surround or cover a portion of a side surface of the first TSV 130.

The first connection bump 170 may be located on the first lower connection pad 142. The first connection bump 170 may electrically connect the semiconductor package 10 with a base substrate (e.g., 600 in FIG. 7). The semiconductor package 10 may receive from an external source at least one of a control signal, a power signal, or a ground signal for operations of the first to fourth semiconductor chips 100, 200, 300, and 400 through the first connection bump 170, receive from an external source a data signal to be stored in the first to fourth semiconductor chips 100, 200, 300, and 400, or provide, from the semiconductor package 10, data stored in the first to fourth semiconductor chips 100, 200, 300, and 400. For example, the first connection bump 170 may include a pillar structure, a ball structure, or a solder layer.

The second semiconductor chip 200 may be mounted on a top surface of the first semiconductor chip 100. The second semiconductor chip 200 may be electrically connected to the first semiconductor chip 100 through the second connection bump 270 between the first semiconductor chip 100 and the second semiconductor chip 200.

A non-conductive film NCF may be formed between the top surface of the first semiconductor chip 100 and a bottom surface of the second semiconductor chip 200 so that the second semiconductor chip 200 may be adhered to the first semiconductor chip 100. As shown in FIG. 1, the non-conductive film NCF may protrude outward from side surfaces of the first semiconductor chip 100 and the second semiconductor chip 200, and a protrusion of the non-conductive film NCF may partially cover portions of the side surfaces of the first semiconductor chip 100 and the second semiconductor chip 200. The non-conductive film NCF will be described in detail below.

The third semiconductor chip 300 may be mounted on a top surface of the second semiconductor chip 200, and the fourth semiconductor chip 400 may be mounted on a top surface of the third semiconductor chip 300. The third connection bump 370 and a non-conductive film NCF may be formed between the second semiconductor chip 200 and the third semiconductor chip 300, and the non-conductive film NCF may cover a side surface of the third connection bump 370. The fourth connection bump 470 and a non-conductive film NCF may be formed between the third semiconductor chip 300 and the fourth semiconductor chip 400, and the non-conductive film NCF may cover a side surface of the fourth connection bump 470.

The second semiconductor chip 200 may include a second semiconductor substrate 210, a second semiconductor device layer 220 having a second interconnection structure 240, a second TSV 230, a second lower connection pad 242, a second upper connection pad 244, and the second connection bump 270.

The third semiconductor chip 300 may include a third semiconductor substrate 310, a third semiconductor device layer 320 having a third interconnection structure 340, a third TSV 330, a third lower connection pad 342, a third upper connection pad 344, and the third connection bump 370.

The fourth semiconductor chip 400 may include a fourth semiconductor substrate 410, a fourth semiconductor device layer 420 having a fourth interconnection structure 440, a fourth lower connection pad 442, and the fourth connection bump 470. The fourth semiconductor chip 400 may not have a TSV, unlike the first to third semiconductor chips 100, 200, and 300.

Since the second to fourth semiconductor chips 200, 300, and 400 have technical characteristics equal or similar to those of the first semiconductor chip 110, detailed descriptions of the second to fourth semiconductor chips 200, 300, and 400 will be omitted.

A first molding member 180 may surround side surfaces of the first to fourth semiconductor chips 100, 200, 300, and 400 and side surfaces of the non-conductive films NCF. In some embodiments, the first molding member 180 may cover a top surface of the fourth semiconductor chip 400. Alternatively, in some embodiments, the first molding member 180 may expose the top surface of fourth semiconductor chip 400. The first molding member 180 may include an epoxy mold compound (EMC).

The semiconductor chips may be structurally thinned so that the semiconductor chips including TSVs and the stacked semiconductor packages can be downscaled and become lighter. As a result, a non-conductive film tends to be used as an interlayer bonding material for semiconductor packages to enable uniform adhesion of semiconductor chips and the bonding of fine connection bumps and achieve solder wettability, electrical reliability, and structural reliability during a process of stacking the semiconductor chips.

After the semiconductor chips are bonded during a process of fabricating the semiconductor packages, however, when a protrusion of the non-conductive film overflows in an excessive amount to the vicinities of the semiconductor chips, several problems may occur during subsequent processes. As a consequence, the quality of the semiconductor packages may deteriorate.

Thus, to reduce the amount of overflow of the protrusion of the non-conductive film, a process of fabricating a semiconductor package may be performed by reducing the thickness of the non-conductive film or increasing the viscosity of the non-conductive film. However, when only the thickness of the non-conductive film is reduced as compared with the height of connection bumps or only the spreading of the non-conductive film is reduced, the non-conductive film may be filled between adjacent semiconductor chips incompletely. Accordingly, the adjacent semiconductor chips may not be uniformly adhered to each other. Alternatively, voids may occur between the adjacent semiconductor chips, degrading the characteristics of semiconductor packages.

To solve these problems, in the semiconductor package 10 according to the embodiment, the non-conductive film NCF may include a first layer 150 and a second layer 160 having different viscosities so that the non-conductive film NCF may be prevented not only from excessively overflowing but also from being incompletely filled between adjacent semiconductor chips.

In some embodiments, although the non-conductive film NCF has been shown to have two or three material layers each having a substantially uniform thickness, the non-conductive film NCF may just include at least two portions, which are vertically stacked and have different viscosities within the spirit and scope of the present disclosure. Therefore, such at least two portions do not necessarily have a uniform thickness or a layer shape as shown in the drawings.

Figure 2:
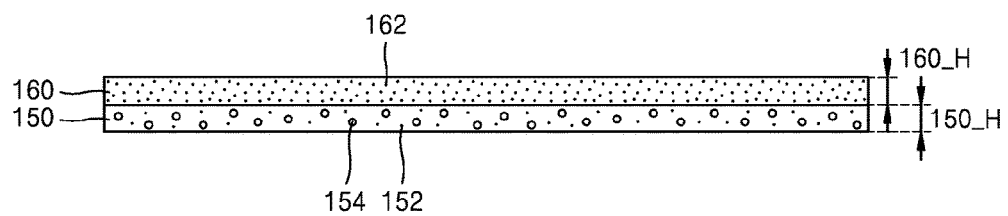
FIG. 2 is a schematic cross-sectional view of a non-conductive film shown in FIG. 1.

FIG. 2 is a schematic cross-sectional view of the non-conductive film NCF shown in FIG. 1.

Referring to FIG. 2, the non-conductive film NCF may include a first layer (or a first material layer) 150 and a second layer (or a second material layer) 160 located on the first layer 150.

The non-conductive film NCF may include an adhesive resin and a flux. The adhesive resin may make the first layer 150 and the second layer 160 to adhere to each other, and make the first layer 150 and the second layer 160 to adhere to semiconductor chips. The adhesive resin may be a thermosetting resin. The adhesive resin may include, for example, at least one of a bisphenol epoxy resin, a novolac epoxy resin, a phenol resin, a urea resin, a melamine resin, an unsaturated polyester resin, and a resorcinol resin.

The first layer 150 may have a different viscosity from the second layer 160. The second layer 160 may have a higher viscosity than the first layer 150. For example, the viscosity of the first layer 150 may be in a range of about 500 Pa·s to about 1,000 Pa·s, and the viscosity of the second layer 160 may be in a range of about 4000 Pa·s to about 5000 Pa·s. Here, the viscosity of each of the first layer 150 and the second layer 160 may refer to a viscosity measured when a viscosity of an adhesive resin included in each of the first and second layers 150 and 160 is lowest at a temperature of about 100° C. The measured temperature may be in an error range of about ±5° C. based on about 100° C.

When the first layer 150 and the second layer 160 have the above-described viscosities, for example, there may be a difference in flow velocity between the first and second layers 150 and 160 during a process of bonding semiconductor chips under pressure to the non-conductive film NCF in the semiconductor package assembly method. Thus, the first layer 150, having a relatively low viscosity, may flow to a greater extent than the second layer 160, having a relatively high viscosity.

Since the second layer 160 has a relatively high viscosity, the second layer 160 may efficiently prevent the non-conductive film NCF from overflowing. The adhesive resin included in the first and second layers 150 and 160 may be changed from a gel state into a liquid state and cured when heat and pressure are applied to the adhesive resin. Here, when the second layer 160 has a relatively high viscosity, the adhesive resin may take a longer time to change from a gel state into a liquid state. Accordingly, when the non-conductive film NCF is bonded under pressure to the semiconductor chips, the adhesive resin included in the second layer 160 may protrude to the vicinities of the semiconductor chips later than the adhesive resin included in the first layer 150. Thus, the non-conductive film NCF may be prevented from excessively overflowing and, in addition, from being incompletely filled between the semiconductor chips.

The first layer 150 and the second layer 160 may include ceramic fillers having different sizes. First ceramic fillers 152 having nanoscale sizes and second ceramic fillers 154 having microscale sizes may be included in the first layer 150 in smaller numbers than in the second layer 160 so that the first layer 150 can have a lower viscosity than the second layer 160. That is, since an average diameter of ceramic fillers included in the first layer 150 is greater than an average diameter of ceramic fillers included in the second layer 160, the number of ceramic fillers included in the first layer 150 may be less than the number of ceramic fillers included in the second layer 160. In another case, first ceramic fillers 162 having nanoscale sizes may be included in the second layer 160 in a larger amount than in the first layer 150 so that the second layer 160 can have a higher viscosity than the first layer 150. That is, since an average diameter of ceramic fillers included in the second layer 160 is less than an average diameter of ceramic fillers included in the first layer 150, the number of ceramic fillers included in the second layer 160 may be greater than the number of ceramic fillers included in the first layer 150.

The flux may be used for a soldering process of electrically bonding semiconductor chips to one another during the fabrication of a semiconductor package. The flux may improve the spreading and/or wettability of solder. The flux may be previously coated on a portion that will be coated with solder. Alternatively, the flux may be included in the non-conductive film NCF. In general, fluxes may be classified into resin fluxes, organic fluxes, and inorganic fluxes. Resin fluxes may be mainly used for electronic devices. Main materials included in the resin fluxes may be, for example, rosins, modified rosins, and synthetic resins. Also, fluxes may be classified into a rosin activated (RA) type, a rosin mildly activated (RMA) type, and a rosin (R) type according to an activation level.

In addition, a thickness 150_H of the first layer 150 may be equal to or less than a thickness 160_H of the second layer 160. For example, when the thickness 150_H of the first layer 150 is about 5 μm, the thickness 160_H of the second layer 160 may be about 10 μm. By forming the first layer 150, having a lower viscosity than the second layer 160, to a smaller thickness than the second layer 160, the amounts of portions of the non-conductive film NCF that protrude to the vicinities of the semiconductor chips may be further reduced. However, the inventive concept is not limited thereto, and the thickness 150_H of the first film 150 and the thickness 160_H of the second layer 160 may vary depending on the kinds of semiconductor chips to be adhered by using the non-conductive film NCF.

Figure 3:
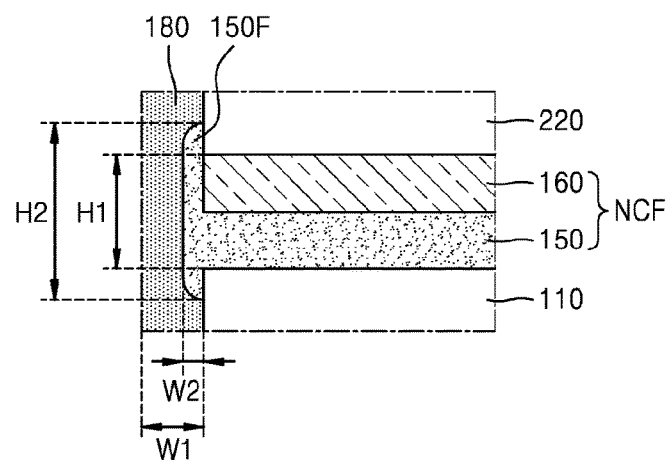
FIG. 3 is an enlarged cross-sectional view of a portion III of FIG. 1, which illustrates a portion of a semiconductor package.

FIG. 3 is an enlarged cross-sectional view of a portion III of FIG. 1, illustrating a portion of the semiconductor package 10.

Referring to FIG. 3, a non-conductive film NCF may include a protrusion 150F, which may protrude outward from the first semiconductor substrate 110 and the second semiconductor device layer 220. The protrusion 150F may partially cover side surfaces of the first semiconductor substrate 110 and the second semiconductor device layer 220.

After the semiconductor package is fabricated, a height H1 between the stacked semiconductor chips may be less than the thickness of an initial non-conductive film NCF. Thus, the non-conductive film NCF may overflow by as much as a difference between the height H1 and the thickness of the initial non-conductive film NCF in the outward directions of the final semiconductor chips. As a result, the protrusion 150F of the non-conductive film NCF may be formed. A height H2 of the protrusion 150F of the non-conductive film NCF may be greater than the height H1 between the stacked semiconductor chips.

Factors that may affect the formation of the protrusion 150F of the non-conductive film NCF may be broadly divided into viscosity, curing rate, and shear stress of the non-conductive film NCF.

Accordingly, in the present embodiment, the viscosity of the non-conductive film NCF may be controlled by using two layers having different viscosities so that the non-conductive film NCF may be prevented from excessively overflowing and, in addition, from being incompletely filled between the first semiconductor substrate 110 and the second semiconductor device layer 220.

The first layer 150 of the non-conductive film NCF may contact the first semiconductor substrate 110, i.e., the top surface of the first semiconductor chip 100, while the second layer 160 of the non-conductive film NCF may contact the second semiconductor device layer 220, i.e., the bottom surface of the second semiconductor chip 200.

Since the first layer 150 has a lower viscosity than the second layer 160, the side surface of the second layer 160 may be partially or completely surrounded by the first layer 150. Also, a portion of the side surface of the first semiconductor chip 100 and a portion of the side surface of the second semiconductor chip 200 may be covered with the non-conductive film NCF. In addition, the first molding member 180 may surround the side surface of the first semiconductor chip 100, the side surface of the second semiconductor chip 200, and the side surface of the non-conductive film NCF and may not expose the non-conductive film NCF. That is, when viewed in a horizontal direction, a width W2 of the protrusion 150F of the non-conductive film NCF from edges of the first and second chips 100, 200 may be less than a width W1 of the first molding member 180. In other words, the first molding member 180 may hermetically seal the non-conductive film NCF.

Figure 4:
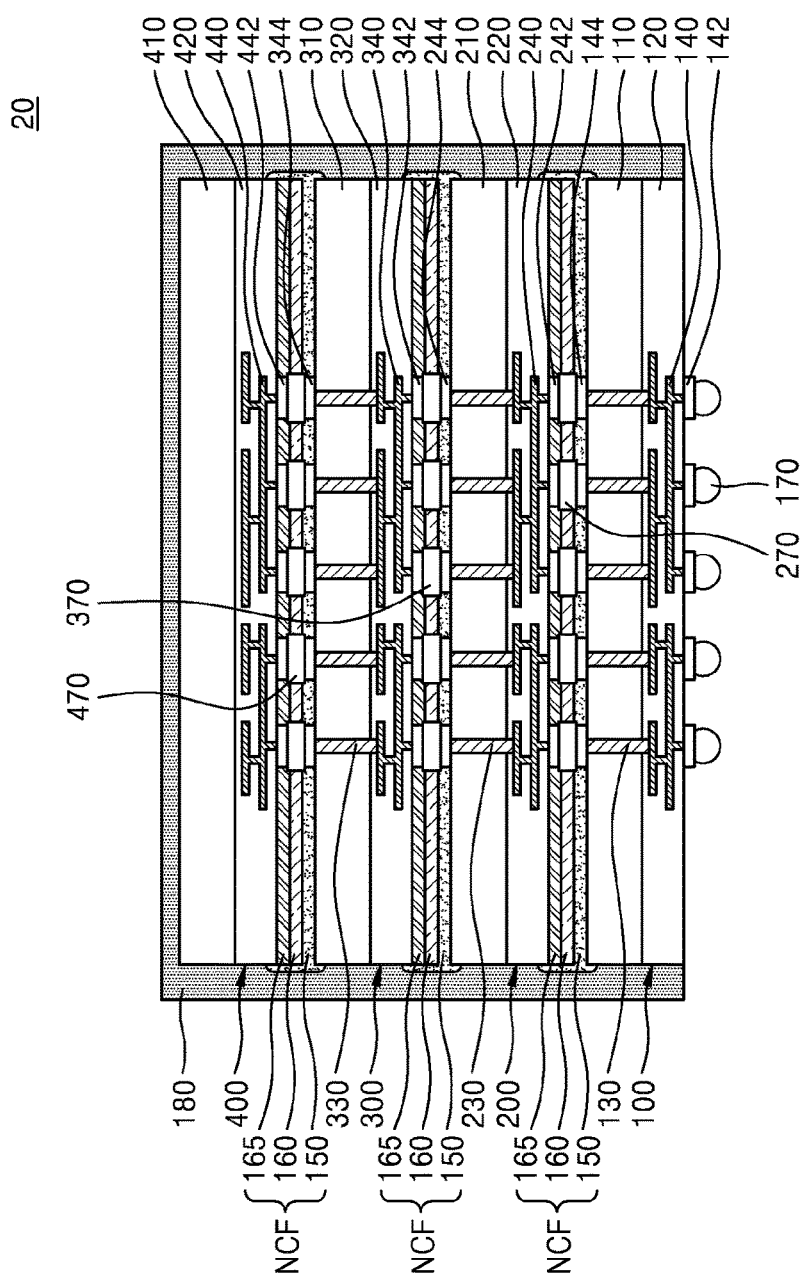
FIG. 4 is a cross-sectional view of a semiconductor package according to an embodiment.

FIG. 4 is a cross-sectional view of a semiconductor package 20 according to an embodiment.

The semiconductor package 20 shown in FIG. 4 may have generally the same configuration as the semiconductor package 10 shown in FIG. 1 except that a non-conductive film NCF includes a first layer 150, a second layer 160, and a third layer 165. In FIG. 4, the same reference numerals are used to denote the same elements as in FIG. 1, and detailed descriptions thereof will be omitted or simplified.

Referring to FIG. 4, the non-conductive film NCF including the first layer 150, the second layer 160, and the third layer 165, having different viscosities, may be formed between the first to fourth semiconductor chips 100, 200, 300, and 400 so that the first to fourth semiconductor chips 100, 200, 300, and 400 may be adhered to one another.

A portion of the non-conductive film NCF may protrude circumferentially from side surfaces of the first to fourth semiconductor chips 100, 200, 300, and 400. The protruding portion of the non-conductive films NCF may cover portions of the side surfaces of the first to fourth semiconductor chips 100, 200, 300, and 400.

The second semiconductor chip 200 may be mounted on a top surface of the first semiconductor chip 100, the third semiconductor chip 300 may be mounted on a top surface of the second semiconductor chip 200, and the fourth semiconductor chip 400 may be mounted on a top surface of the third semiconductor chip 300.

A second connection bump 270 and a non-conductive film NCF may be formed between the first semiconductor chip 100 and the second semiconductor chip 200. The non-conductive film NCF may surround a side surface of the second connection bump 270 and include a first layer 150, a second layer 160, and a third layer 165, which may have different viscosities.

A third connection bump 370 and the non-conductive film NCF may be between the second semiconductor chip 200 and the third semiconductor chip 300. The non-conductive film NCF may surround a side surface of the third connection bump 370 and include the first layer 150, the second layer 160, and the third layer 165, which may have different viscosities.

A fourth connection bump 470 and the non-conductive film NCF may be between the third semiconductor chip 300 and the fourth semiconductor chip 400. The non-conductive film NCF may surround a side surface of the fourth connection bump 470 and include the first layer 150, the second layer 160, and the third layer 165, which may have different viscosities.

Figure 5:
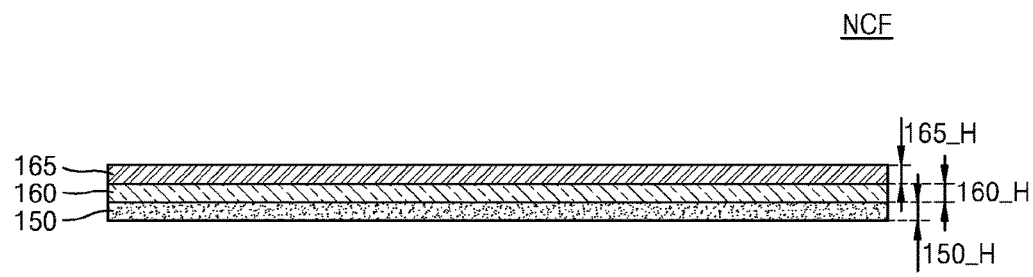
FIG. 5 is a schematic cross-sectional view of a non-conductive film shown in FIG. 4.

FIG. 5 is a schematic cross-sectional view of the non-conductive film NCF shown in FIG. 4.

Referring to FIG. 5, the non-conductive film NCF may include a first layer 150, a second layer 160 located on the first layer 150, and a third layer 165 located on the second layer 160.

The first, second, and third layers 150, 160, and 165 included in the non-conductive film NCF may have increasing viscosities in a direction away from the first semiconductor chip 100. In other words, the first, second, and third layers 150, 160, and 165 may have different viscosities. The first layer 150 may have a lower viscosity than a viscosity of the second layer 160, and the second layer 160 may have a lower viscosity than a viscosity of the third layer 165.

In addition, the first, second, and third layers 150, 160, and 165 included in the non-conductive film NCF may include fillers such as ceramic filers having smaller average diameters in the direction away from the first semiconductor chip 100. That is, the first, second, and third layers 150, 160, and 165 may include fillers such as ceramic fillers having different sizes. The fillers included in the first layer 150 may have a larger average diameter than an average diameter of the fillers included in the second layer 160, and the fillers included in the second layer 160 may have a larger average diameter than that of the fillers included in the third layer 165.

Furthermore, a thickness 150_H of the first layer 150 may be equal to or smaller than the sum of a thickness 160_H of the second layer 160 and a thickness 165_H of the third layer 165. For example, when the thickness 150_H of the first layer 150 is about 5 μm, each of the thickness 160_H of the second layer 160 and the thickness 165_H of the third layer 165 may be about 5 μm. By forming the first layer 150 having a lower viscosity than the second and third layers 160 and 165 to a smaller thickness than the second and third layers 160 and 165, the amount of the non-conductive film NCF that protrudes to the vicinities of the semiconductor chips may be further reduced. However, the inventive concept is not limited thereto, and the thickness 150_H of the first layer 150, the thickness 160_H of the second layer 160, and the thickness 165_H of the third layer 165 may vary depending on the kinds of semiconductor chips to be bonded to each other by using the non-conductive film NCF.

Figure 6:
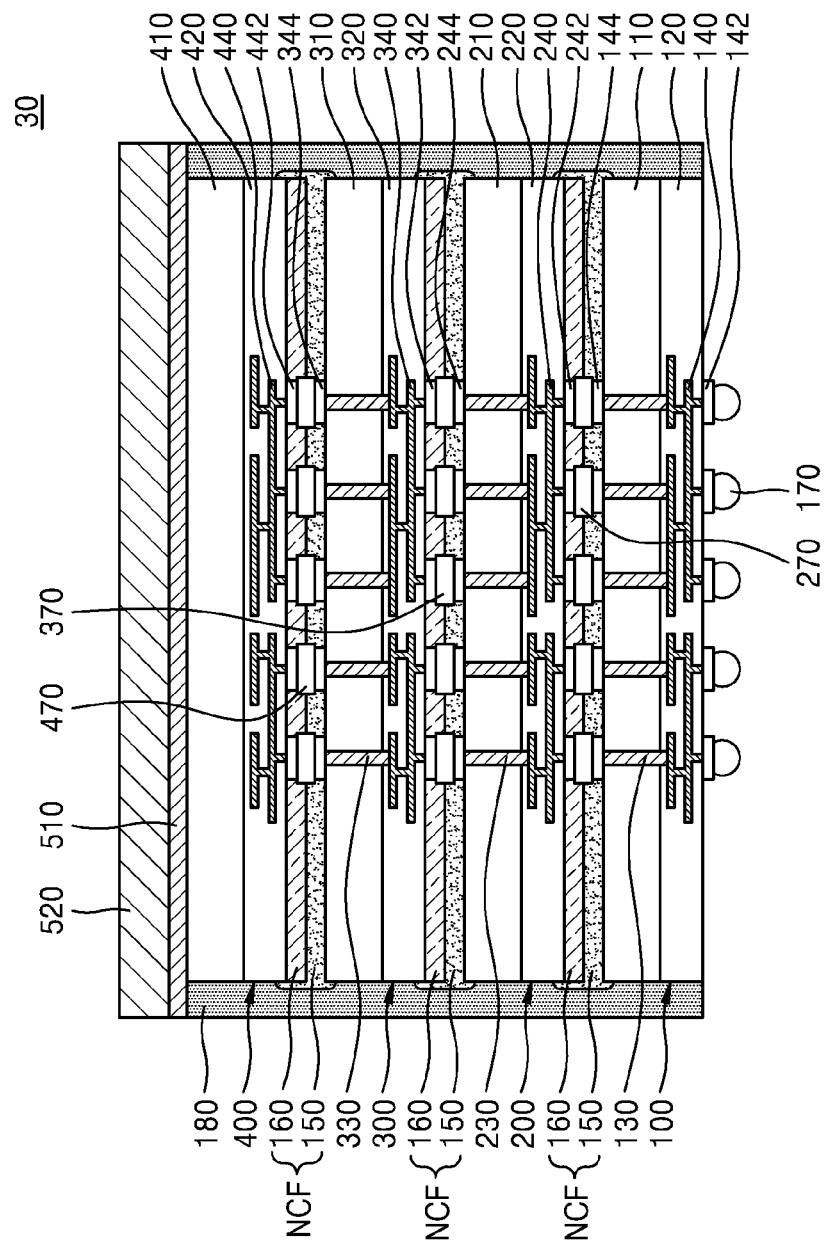
FIG. 6 is a cross-sectional view of a semiconductor package according to an embodiment.

FIG. 6 is a cross-sectional view of a semiconductor package 30 according to an embodiment.

The semiconductor package 30 shown in FIG. 6 may have generally the same configuration as the semiconductor package 10 shown in FIG. 1 except that the semiconductor package 30 further includes a thermal interface material (TIM) layer 510 and a radiation plate 520, sequentially formed on a top surface of a fourth semiconductor chip 400. In FIG. 6, the same reference numerals are used to denote the same elements as in FIG. 1, and detailed descriptions thereof are omitted or simplified.

Referring to FIG. 6, the semiconductor package 30 may include first to fourth semiconductor chips 100, 200, 300, and 400, a TIM layer 510, and a radiation plate 520, which are stacked in a vertical direction.

The TIM layer 510 may be located between the radiation plate 520 and the fourth semiconductor chip 400 and cover the top surface of the fourth semiconductor chip 400. The TIM layer 510 may facilitate radiation of heat generated by the first to fourth semiconductor chips 100, 200, 300, and 400 to the radiation plate 520. The TIM layer 510 may include a TIM. For example, the TIM layer 510 may include an insulating material or a material including an insulating material to maintain electrical insulation characteristics. The TIM layer 510 may include, for example, an epoxy resin. The TIM layer 510 may include, for example, mineral oil, grease, gap filler putty, phase change gel, phase change material pads, or particle filled epoxy.

The radiation plate 520 may be located on the TIM layer 510. The radiation plate 520 may be, for example, a heat sink, a heat spreader, a heat pipe, or a liquid-cooled cold plate.

The contact area between the fourth semiconductor chip 400 and the TIM layer 510 may be increased by completely covering the top surface of the fourth semiconductor chip 400 with the TIM layer 510. Thus, heat generated by the first to fourth semiconductor chips 100, 200, 300, and 400 may be efficiently transmitted to the radiation plate 520.

Figure 7:
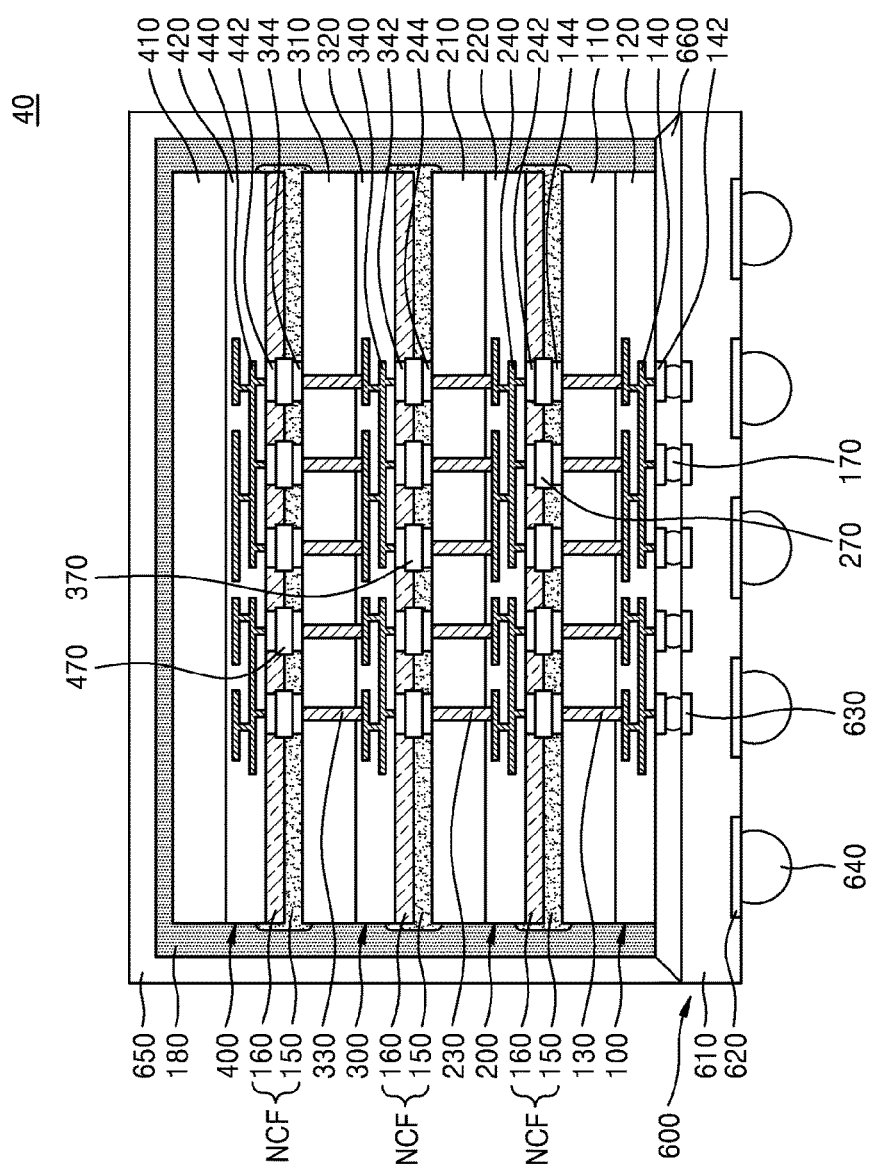
FIG. 7 is a cross-sectional view of a semiconductor package according to an embodiment.

FIG. 7 is a cross-sectional view of a semiconductor package 40 according to an embodiment.

The semiconductor package 40 shown in FIG. 7 may have generally the same configuration as the semiconductor package 10 shown in FIG. 1 except that the semiconductor package 40 shown in FIG. 4 further includes a base substrate 600. In FIG. 7, the same reference numerals are used to denote the same elements as in FIG. 1, and detailed descriptions thereof will be omitted or simplified.

Referring to FIG. 7, the semiconductor package 40 may include a base substrate 600 and first to fourth semiconductor chips 100, 200, 300, and 400 mounted on the base substrate 600 and sequentially stacked on a top surface of the base substrate 600 in a vertical direction.

The base substrate 600 may be, for example, a printed circuit board (PCB), a ceramic substrate, or an interposer. When the base substrate 600 is a PCB, the base substrate 600 may include a substrate body unit 610, bottom pads 620, top pads 630, and solder resist layers (not shown) formed on bottom and top surfaces of the substrate body unit 610. Internal interconnections (not shown) may be formed in the substrate body unit 610 and configured to electrically connect the bottom pads 620 with the top pads 630. The bottom and top surfaces of the substrate body unit 610 may be coated with copper foil and patterned to form the circuit interconnections. The bottom pads 620 and the top pads 630 may be portions of the circuit interconnections, which are exposed by the solder resist layers formed on the bottom and top surfaces of the substrate body unit 610, respectively.

When the base substrate 600 is an interposer, the base substrate 600 may include the substrate body unit 610 including a semiconductor material and the bottom pads 620 and the top pads 630, which are respectively formed on the bottom surface and the top surface of the substrate body unit 610. The substrate body unit 610 may be formed by using, for example, a semiconductor wafer such as a silicon wafer. Also, an internal interconnection (not shown) may be formed on the bottom surface or the top surface of the substrate body unit 610 or in the substrate body unit 610. In addition, through vias (not shown) may be formed in the substrate body unit 610 and electrically connect the bottom pads 620 with the top pads 630.

External connection terminals 640 may be adhered to a bottom surface of the base substrate 600. For example, the external connection terminals 640 may be adhered to the bottom pads 620. The external connection terminals 640 may be, for example, solder balls or conductive bumps. The external connection terminals 640 may electrically connect the semiconductor package 40 with an external apparatus.

A second molding member 650 may be formed on the base substrate 600 and partially or completely surround the first to fourth semiconductor chips 100, 200, 300, and 400. The second molding member 650 may surround the first molding member 180 and not in direct contact with side surfaces of the first to fourth semiconductor chips 100, 200, 300, and 400. The second molding member 650 may be, for example, an EMC.

An under-fill material layer 660 may be formed between the base substrate 600 and the first semiconductor chip 100. The under-fill material layer 660 may be formed between the base substrate 600 and the first semiconductor chip 100 and surround a side surface of a first connection bump 170. The under-fill material layer 660 may include, for example, an epoxy resin. In some embodiments, the under-fill material layer 660 may be a portion of the second molding member 650 formed by using a molded underfill (MUF) method.

In some embodiments, not the under-fill material layer 660 but a non-conductive film NCF may be formed between the base substrate 600 and the first semiconductor chip 100. The non-conductive film NCF may be formed between the base substrate 600 and the first semiconductor chip 100 and surround a side surface of the first connection bump 170.

Figure 8:
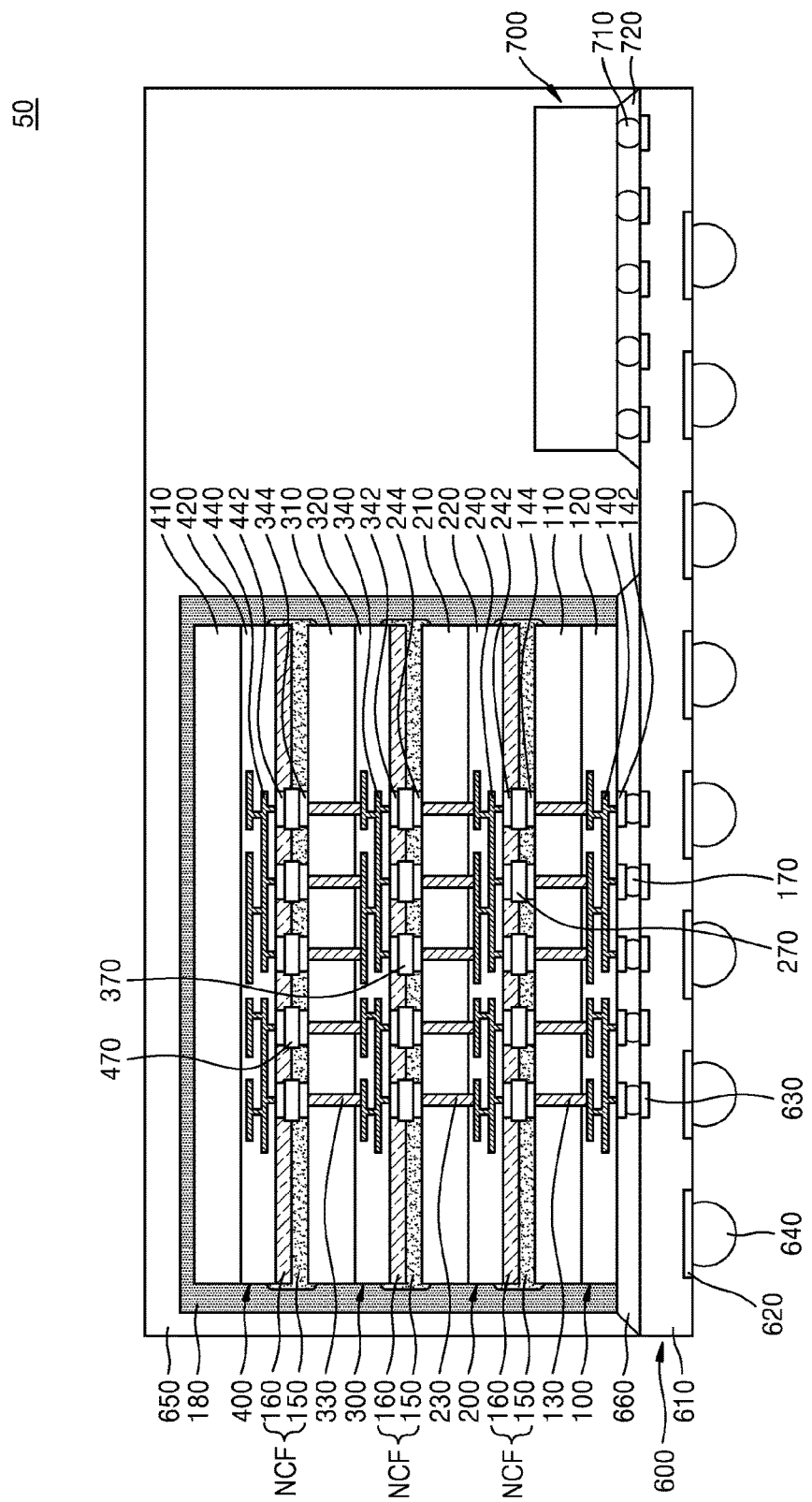
FIG. 8 is a cross-sectional view of a semiconductor package according to an embodiment.

FIG. 8 is a cross-sectional view of a semiconductor package 50 according to an embodiment.

The semiconductor package 50 shown in FIG. 8 may have generally the same configuration as the semiconductor package 40 shown in FIG. 7 except that a main semiconductor chip 700 is adhered to another portion of a base substrate 600 that is different from a portion of the base substrate 600 to which first to fourth semiconductor chips 100, 200, 300, and 400 that are sequentially stacked are adhered. In FIG. 8, the same reference numerals are used to denote the same elements, and detailed descriptions thereof are omitted or simplified.

Referring to FIG. 8, the semiconductor package 50 may include a main semiconductor chip 700, which is adhered to an area of the base substrate 600, and first to fourth semiconductor chips 100, 200, 300, and 400, which are sequentially stacked on another area of the base substrate 600.

The main semiconductor chip 700 may be a processor unit. The main semiconductor chip 700 may be, for example, a microprocessor unit (MPU) or a graphic processor unit (GPU). In some embodiments, the main semiconductor chip 700 may be a package of which operations are verified as normal, that is, a known good package (KGP). A main connection terminal 710 may be adhered to a bottom surface of the main semiconductor chip 700. A main under-fill material layer 720 may be additionally formed between the main semiconductor chip 700 and the base substrate 600 to enclose the main connection terminal 710. The main under-fill material layer 720 may include the same material as the under-fill material layer 660.

The under-fill material layer 660 may be formed between the base substrate 600 and the first semiconductor chip 100. The under-fill material layer 660 may be formed between the base substrate 600 and the first semiconductor chip 100 and surround a side surface of a first connection bump 170.

In some embodiments, a non-conductive film NCF instead of the under-fill material layer 660 may be formed between the base substrate 600 and the first semiconductor chip 100. The non-conductive film NCF may be formed between the base substrate 600 and the first semiconductor chip 100 and surround the side surface of the first connection bump 170.

FIGS. 9A to 9I are cross-sectional views of processing steps according to a method of fabricating a semiconductor package according to an embodiment.

A method of fabricating the semiconductor package 10 shown in FIG. 1 will described with reference to FIGS. 9A to 9I according to some embodiments.

Figure 9A:
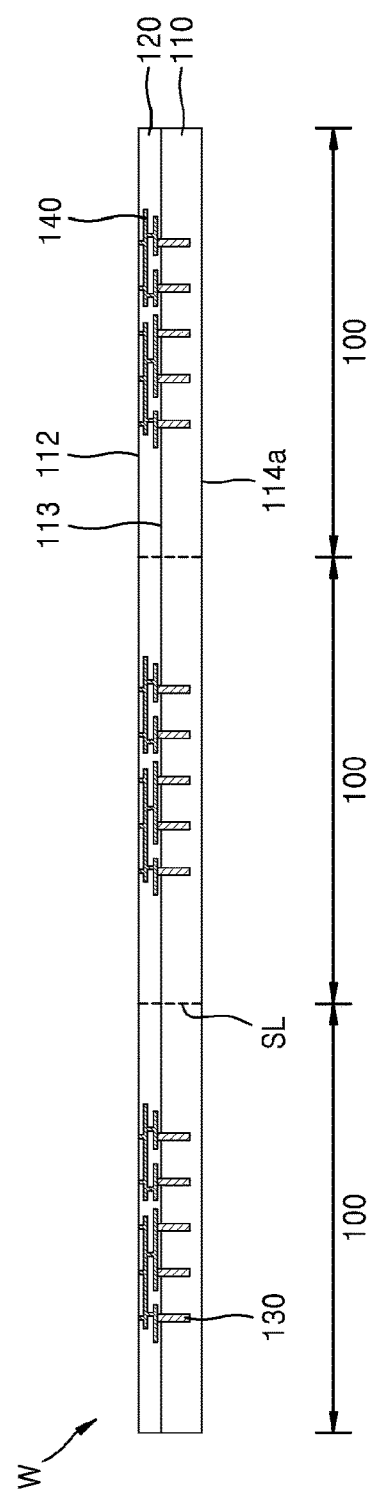
FIGS. 9A to 9I are cross-sectional views of process operations of a method of fabricating a semiconductor package, according to an embodiment.

Referring to FIG. 9A, a semiconductor wafer W is provided. The semiconductor wafer W includes a plurality of first semiconductor chips 100, which are divided from one another by a scribe line SL. The first semiconductor chip 100 may include a first semiconductor substrate 110, a first semiconductor device layer 120, and first TSVs 130. The first semiconductor substrate 110 may include a bottom surface 113 and a top surface 114a, opposite to each other. The first semiconductor device layer 120 may be formed on the bottom surface 113 of the first semiconductor substrate 110. The first TSVs 130 may penetrate at least a portion of the first semiconductor substrate 110 and be connected to a first interconnection structure 140 included in the first semiconductor device layer 120.

Figure 9B:
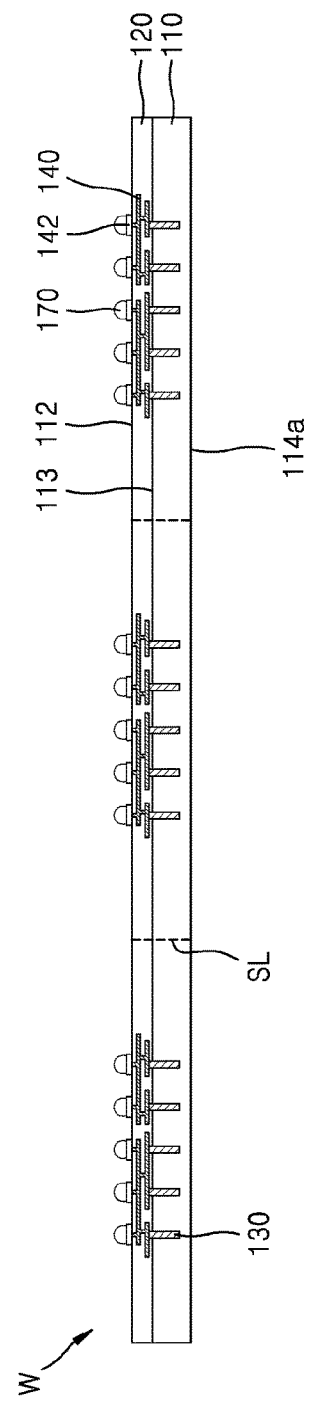

Referring to FIG. 9B, first connection pads 142 and first connection bumps 170 may be formed on a surface 112 of the first semiconductor device layer 120 and electrically connected to the first TSVs 130.

The first connection pads 142 may be formed by depositing a metal layer on the surface 112 of the first semiconductor device layer 120 and patterning the metal layer.

The first connection bumps 170 may be formed by forming a mask pattern (not shown) having openings to expose portions of the first connection pads 142 on the first semiconductor device layer 120 and forming a conductive material that forms the first connection bumps 170 on the first connection pads 142 exposed through the openings of the mask pattern. For example, the conductive material that forms the first connection bumps 170 may include a pillar structure and a solder layer, which are sequentially formed by using an electroplating process. Thereafter, the mask pattern may be removed, and the first connection bumps 170 having convex shapes may be formed by performing a reflow process.

Figure 9C:
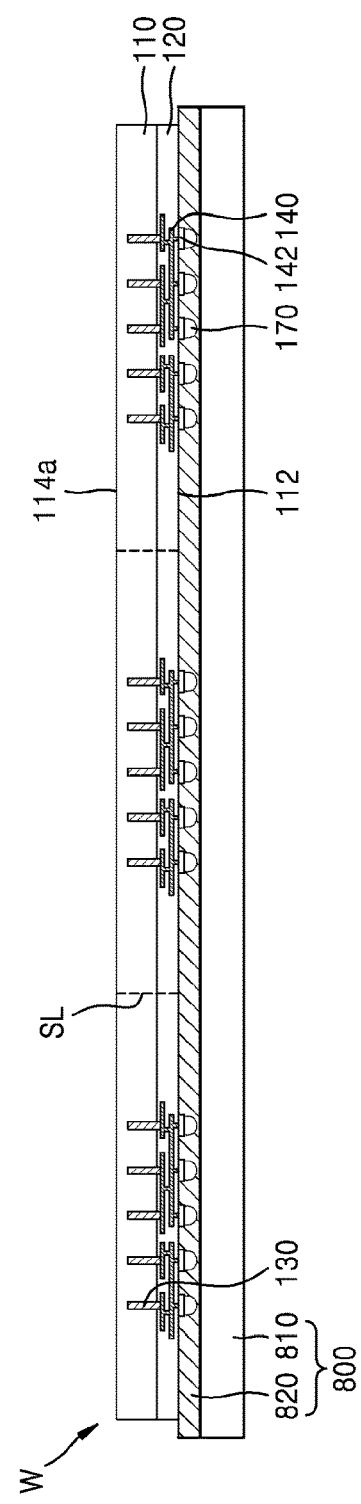

Referring to FIG. 9C, the semiconductor wafer W having the first connection bumps 170 may be adhered to a first carrier substrate 800. The first carrier substrate 800 may include a first support substrate 810 and an adhesive material layer 820. The semiconductor wafer W may be adhered to the first carrier substrate 800 so that the first connection bumps 170 may face the first carrier substrate 800. The first connection bumps 170 may be covered or surrounded by the adhesive material layer 820. A portion of the surface 112 of the first semiconductor device layer 120 on which the first connection bumps 170 are not formed may contact the adhesive material layer 820.

Figure 9D:
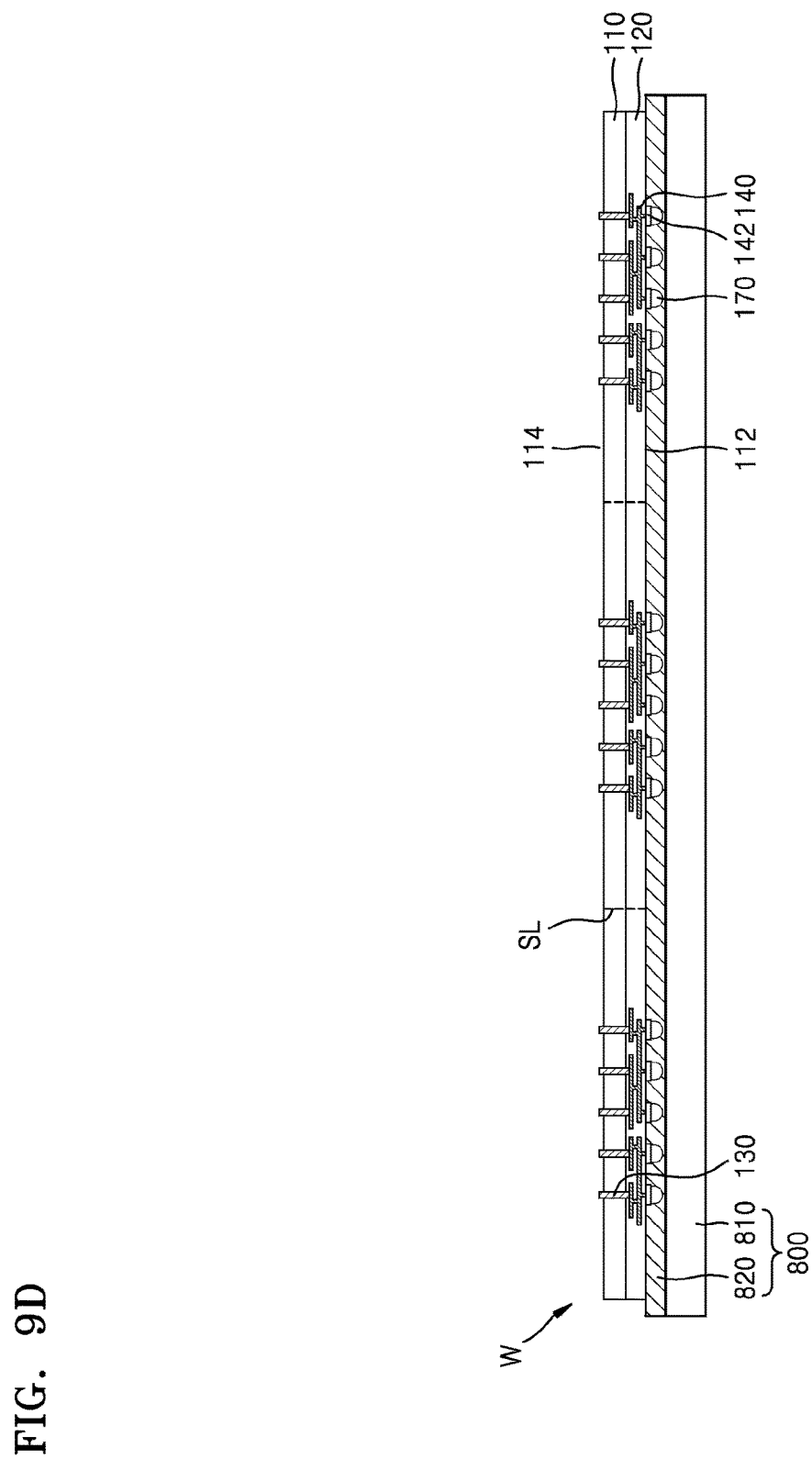

Referring to FIG. 9D, the first TSVs 130 may be exposed by removing portions of the semiconductor wafer W. That is, the portions of the semiconductor wafer W may be removed so that at least portions of the first TSVs 130 may protrude from an exposed surface of the semiconductor wafer W or a top surface 114 of the first semiconductor substrate 110.

For example, the portions of the semiconductor wafer W may be removed by using a chemical mechanical polishing (CMP) process, an etchback process, or a combination thereof to expose the first TSVs 130.

Figure 9E:
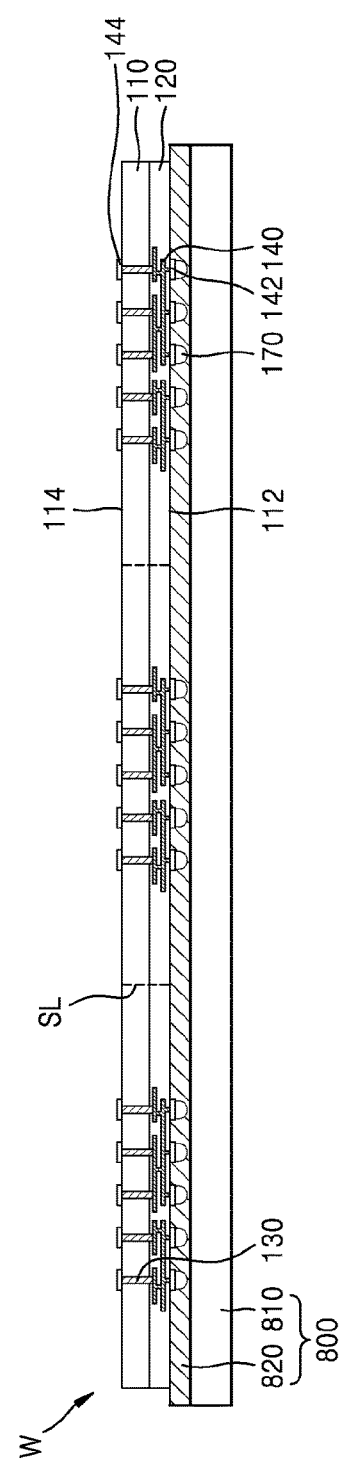

Referring to FIG. 9E, the exposed surface of the semiconductor wafer W (i.e., the top surface 114 of the first semiconductor substrate 110) may be covered with an upper passivation layer (not shown), and first upper connection pads 144 may be formed on the upper passivation layer and electrically connected to the first TSVs 130.

The upper passivation layer may be formed and has openings to expose the first TSVs 130. The upper passivation layer may include, for example, an insulating polymer.

Figure 9F:
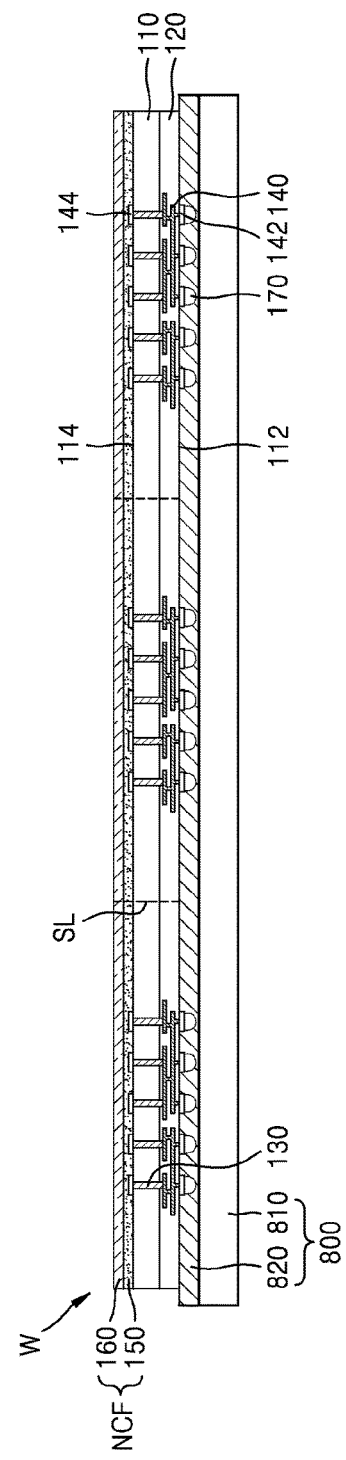

Referring to FIG. 9F, a non-conductive film NCF including a first layer 150 and a second layer 160 having different viscosities may be adhered to the top surface 114 of the first semiconductor substrate 110. The non-conductive film NCF may be formed on the semiconductor wafer W on which a cutting process is not performed.

The first layer 150 is formed on the semiconductor wafer W and then the second layer 160 is formed on the first layer 150 such that the non-conductive film NCF, for example, the multilayer structure including the first layer 150 and the second layer 160, is adhered to the top surface 114 of the first semiconductor substrate 110. Alternatively, the non-conductive film NCF in which the second layer 160 is previously formed on the first layer 150 is adhered to the semiconductor wafer W, i.e., the top surface 114 of the first semiconductor substrate 110.

Figure 9G:
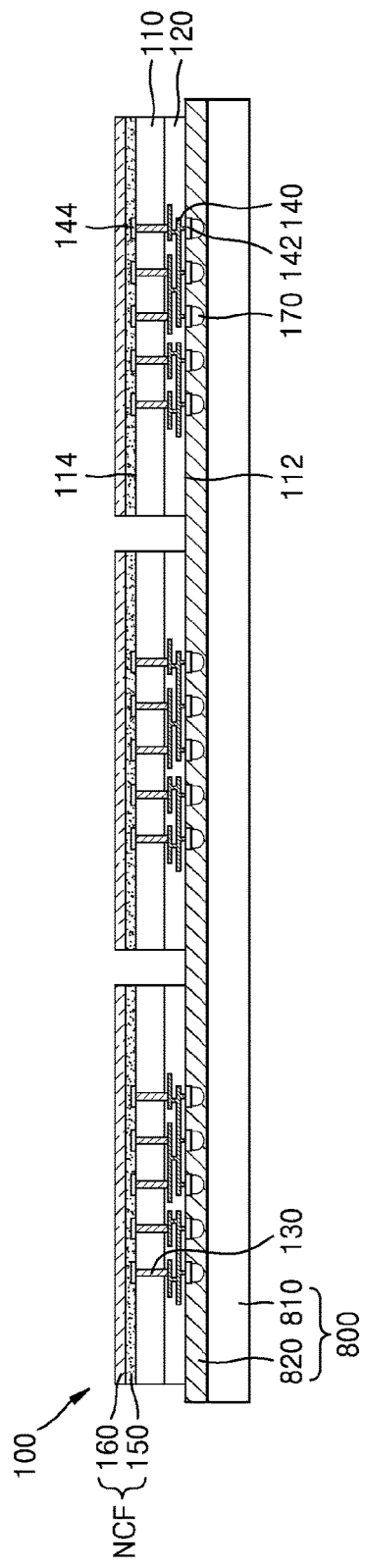

Referring to FIG. 9G, the semiconductor wafer (refer to W in FIG. 9F) to which the non-conductive film NCF is adhered may be cut along the scribe lane (refer to SL in FIG. 9F) by, for example, using a sawing blade (not shown) so that the semiconductor wafer W may be separated (singulated) into a plurality of first semiconductor chips 100. The singulated first semiconductor chips 100 may be positioned in a row in a horizontal direction.

Figure 9H:
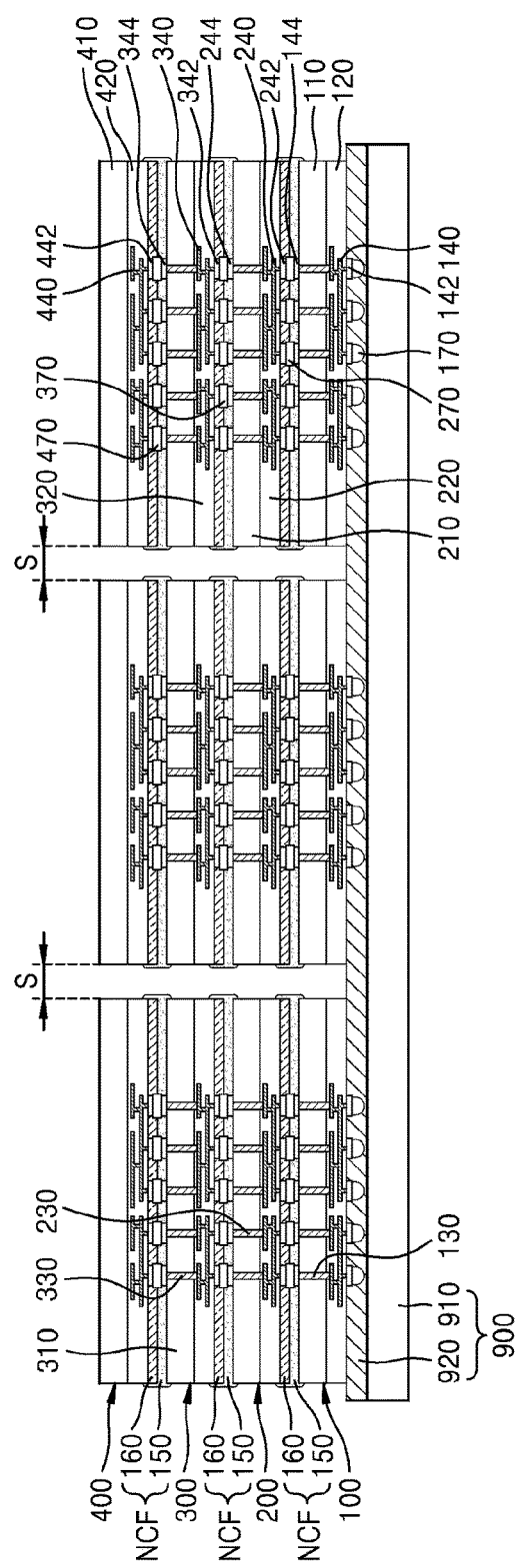

Referring to FIG. 9H, first semiconductor chips 100, second semiconductor chips 200, third semiconductor chips 300, and fourth semiconductor chips 400 may be sequentially stacked on a second carrier substrate 900 including a second support substrate 910 and an adhesive material layer 920.

More specifically, initially, the first to fourth semiconductor chips 100, 200, 300, and 400 may be prepared. The second semiconductor chips 200 and the third semiconductor chips 300 may be provided by using a method that is the same as or similar to the method described with reference to FIGS. 9A to 9G. However, the fourth semiconductor chip 400 may be provided by omitting the process of adhering the non-conductive film NCF, which is described with reference to FIG. 9F.

The first to fourth semiconductor chips 100, 200, 300, and 400 may be homogeneous semiconductor chips, which may include the same type of discrete devices. Alternatively, at least one of the first to fourth semiconductor chips 100, 200, 300, and 400 may be heterogeneous semiconductor chips including different discrete devices.

Next, the singulated first semiconductor chips 100 may be spaced a constant distance S apart from one another and mounted on the second carrier substrate 900 by using a semiconductor chip transfer device (not shown). The distance S may be a distance within which the first molding member (refer to 180 in FIG. 9I) may surround or cover side surfaces of the first to fourth semiconductor chips 100, 200, 300, and 400 and side surfaces of the non-conductive films NCF in a subsequent process.

Next, the second semiconductor chips 200 may be stacked on the first semiconductor chips 100 such that the second semiconductor chips 200 may respectively correspond to the first semiconductor chips 100. In this case, the non-conductive film NCF including the first layer 150 and the second layer 160 having different viscosities may be formed between the first semiconductor chips 100 and the second semiconductor chips 200, and second connection bumps 270 may be connected to the first upper connection pads 144.

As explained above, the non-conductive film NCF may be formed on top surfaces of the first semiconductor chips 100 before the second semiconductor chips 200 are stacked on the first semiconductor chips 100. In some embodiments, the non-conductive film NCF may be formed on bottom surfaces of the second semiconductor chips 200 before the second semiconductor chips 200 are stacked on the first semiconductor chips 100.

After the second semiconductor chips 200 are stacked on the first semiconductor chips 100, predetermined heat and pressure may be applied to the second connection bumps 270 and the non-conductive film NCF between the first semiconductor chips 100 and the second semiconductor chips 200. Thus, the non-conductive film NCF may be hardened, so the second semiconductor chips 200 may be tightly adhered to the top surface of the first semiconductor chips 100 and an intermetallic compound may be formed between the second connection bumps 270 and the first upper connection pads 144 to reduce a contact resistance therebetween.

In some embodiments, the viscosity of the non-conductive film NCF may be controlled by using a multilayer structure, e.g., two layers (i.e., the first and second layers 150 and 160) having different viscosities, so that the non-conductive film NCF may be prevented from excessively overflowing and, in addition, from being incompletely filled between the first semiconductor chips 100 and the second semiconductor chips 200. Accordingly, although a portion of the non-conductive film NCF may protrude outward from the first semiconductor chips 100 and the second semiconductor chips 200, the non-conductive film NCF may not excessively overflow to side surfaces of the first semiconductor chips 100 and the second semiconductor chips 200.

Subsequently, substantially the same process as the above-described process of stacking the second semiconductor chips 200 on the first semiconductor chips 100 may be performed so that the third semiconductor chips 300 may be stacked on the second semiconductor chips 200.

Finally, substantially the same process as the above-described process of stacking the second semiconductor chips 200 on the first semiconductor chips 100 may be performed so that the fourth semiconductor chips 400 may be stacked on the third semiconductor chips 300.

Figure 9I:
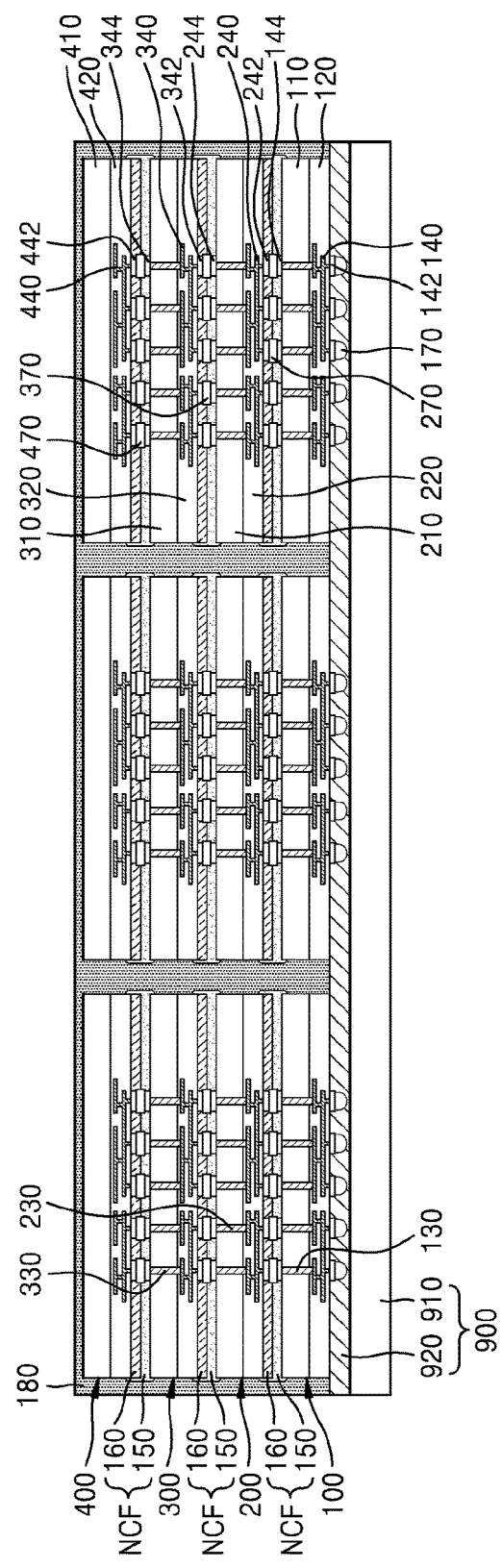

Referring to FIG. 9I, a first molding member 180 may be formed to cover the first to fourth semiconductor chips 100, 200, 300, and 400. The first molding member 180 may cover side surfaces of the first to fourth semiconductor chips 100, 200, 300, and 400 and/or top surfaces of the fourth semiconductor chips 400. Also, the first molding member 180 may surround a side surface of the non-conductive film NCF. Next, a cutting process may be performed. As a result, semiconductor packages 10 including the first to fourth semiconductor chips 100, 200, 300, and 400 shown in FIG. 1 may be separated from one another.

Although the method of fabricating a semiconductor package 10 has been described thus far with reference to FIGS. 9A to 9I, it should be clear to one skilled in the art that semiconductor packages 20, 30, 40, and 50 having various structures other than the semiconductor package 10 may be fabricated by making various changes in forms and details therein within the scope of the inventive concept.

Figure 10:
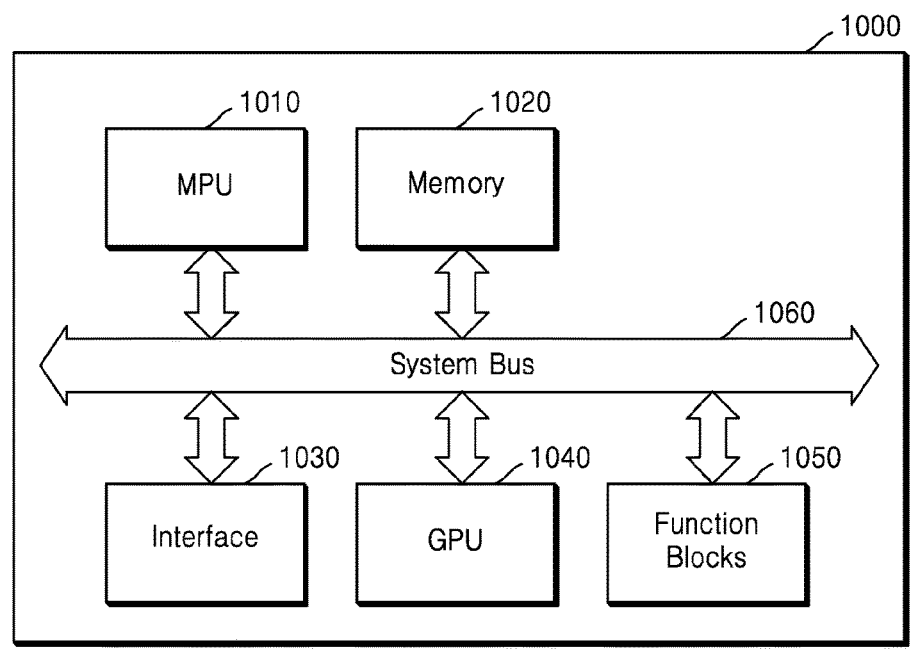
FIG. 10 is a schematic diagram of configuration of a semiconductor package according to an embodiment.

FIG. 10 is a schematic diagram of configuration of a semiconductor package 1000 according to an embodiment.

Referring to FIG. 10, the semiconductor package 1000 may include a micro-processing unit (MPU) 1010, a memory 1020, an interface 1030, a graphics-processing unit (GPU) 1040, and function blocks 1050, which may be connected to one another by a system bus 1060. The semiconductor package 1000 may include at least one of the MPU 1010 and the GPU 1040.

The MPU 1010 may include a core and an L2 cache. For example, the MPU 1010 may include a multi-core. Respective cores included in the multi-core may have the same performance or different performances. Also, the respective cores included in the multi-core may be activated simultaneously or in different time points.

The memory 1020 may store results of operations processed by the function blocks 1050 under the control of the MPU 1010. The interface 1030 may exchange information or signals with external apparatuses. The GPU 1040 may perform graphics functions. For example, the GPU 1040 may perform video codec functions or process 3D graphics. The function blocks 1050 may perform various functions. For instance, when the semiconductor package 1000 is an application processor (AP) used for a mobile device, some of the function blocks 1050 may perform communication functions.

The semiconductor package 1000 may include at least one of the semiconductor packages 10, 20, 30, 40, and 50 described with reference to FIGS. 1 to 8.

While the inventive concept has been particularly shown and described with reference to embodiments thereof, it will be understood that various changes in form and details may be made therein without departing from the spirit and scope of the following claims.

What is claimed is:

1. A semiconductor package comprising:
   a first semiconductor chip comprising a first through-silicon via (TSV);
   a second semiconductor chip stacked on the first semiconductor chip, the second semiconductor chip comprising a second TSV;
   a connection member between the first semiconductor chip and the second semiconductor chip, and electrically connecting the first TSV and the second TSV; and
   a non-conductive film between the first semiconductor chip and the second semiconductor chip, and on a side surface of the connection member, the non-conductive film comprising a first layer and a second layer that are vertically stacked, and the first layer directly contacting a top surface of the first semiconductor chip and the second layer directly contacting a bottom surface of the second semiconductor chip,
   wherein the first layer extends onto a side surface of the second layer,
   wherein the first layer and the second layer have different viscosities, respectively, and
   wherein the viscosity of the second layer is higher than that of the first layer.

2. The semiconductor package of claim 1, wherein a thickness of the non-conductive film has a range of 10 micrometers (μm) to 20 μm.

3. The semiconductor package of claim 1, wherein a thickness of the first layer measured at a center portion of the first layer is less than a thickness of the second layer measured at a center portion of the second layer.

4. The semiconductor package of claim 1, wherein the first semiconductor chip and the second semiconductor chip are covered by an epoxy mold compound (EMC), and a side surface of the first layer contacts the EMC.

5. The semiconductor package of claim 4, wherein the side surface of the second layer does not contact the EMC.

6. The semiconductor package of claim 1,
   wherein the first layer and the second layer comprise first ceramic fillers and second ceramic fillers, respectively, and
   wherein an average diameter of the first ceramic fillers is greater than an average diameter of the second ceramic fillers.

7. The semiconductor package of claim 1, wherein a portion of a side surface of the first semiconductor chip is free of the first layer.

8. The semiconductor package of claim 1, wherein a portion of a side surface of the second semiconductor chip is free of the first layer.

9. A semiconductor package comprising:
   a first semiconductor chip comprising a first through-silicon via (TSV);
   a second semiconductor chip stacked on the first semiconductor chip, the second semiconductor chip comprising a second TSV;
   a connection member between the first semiconductor chip and the second semiconductor chip, and electrically connecting the first TSV and the second TSV; and
   a non-conductive film between the first semiconductor chip and the second semiconductor chip, and on a side surface of the connection member, the non-conductive film comprising a first layer and a second layer that are vertically stacked, and the first layer directly contacting a top surface of the first semiconductor chip and the second layer directly contacting a bottom surface of the second semiconductor chip,
   wherein the first layer extends onto a side surface of the second layer,
   wherein the first layer further extends onto a first portion of a side surface of the second semiconductor chip, and
   wherein a second portion of the side surface of the second semiconductor chip is free of the first layer.

10. The semiconductor package of claim 9,
    wherein the first layer further extends onto a first portion of a side surface of the first semiconductor chip, and
    wherein a second portion of the side surface of the first semiconductor chip is free of the first layer.

11. The semiconductor package of claim 9, wherein a horizontal width of a first portion of the first layer on the side surface of the second layer is thinner than a vertical thickness of a second portion of the first layer between the top surface of the first semiconductor chip and a bottom surface of the second layer.

12. A semiconductor package comprising:
    a base substrate;
    a first semiconductor chip comprising a first through-silicon via (TSV);
    a second semiconductor chip stacked on the first semiconductor chip, the second semiconductor chip comprising a second TSV;
    a first connection member between the first semiconductor chip and the second semiconductor chip, and electrically connecting the first TSV and the second TSV;
    a second connection member between the base substrate and the first semiconductor chip, and electrically connecting a pad on the base substrate and the first TSV;
    a first non-conductive film between the first semiconductor chip and the second semiconductor chip and on a side surface of the first connection member, the first non-conductive film comprising a first layer and a second layer that are vertically stacked, and the first layer directly contacting a top surface of the first semiconductor chip and the second layer directly contacting a bottom surface of the second semiconductor chip; and a second non-conductive film between the base substrate and the first semiconductor chip and on a side surface of the second connection member, the second non-conductive film comprising a third layer and a fourth layer that are vertically stacked, and the third layer directly contacting a top surface of the base substrate and the fourth layer directly contacting a bottom surface of the first semiconductor chip, wherein the first layer extends onto a side surface of the second layer, and the third layer extends onto a side surface of the fourth layer, wherein the third layer and the fourth layer comprise third ceramic fillers and fourth ceramic fillers, respectively, and wherein an average diameter of the third ceramic fillers is greater than an average diameter of the fourth ceramic fillers.

13. The semiconductor package of claim 12,
wherein the third layer further extends onto a first portion of a side surface of the first semiconductor chip, and
wherein a second portion of the side surface of the first semiconductor chip is free of the third layer.

14. The semiconductor package of claim 12, wherein a width of the base substrate is greater than that of the first semiconductor chip.

15. The semiconductor package of claim 12, wherein the third layer and the fourth layer have different viscosities, respectively.

16. The semiconductor package of claim 15, wherein the viscosity of the fourth layer is higher than that of the third layer.

17. The semiconductor package of claim 12, wherein a thickness of the second non-conductive film has a range of 10 micrometers ($\mu$m) to 20 $\mu$m.

18. The semiconductor package of claim 12, wherein a thickness of the third layer measured at a center portion of the third layer is less than a thickness of the fourth layer measured at a center portion of the fourth layer.

19. The semiconductor package of claim 12, wherein the first semiconductor chip is covered by an epoxy mold compound (EMC), and a side surface of the third layer contacts the EMC.

20. The semiconductor package of claim 19, wherein the side surface of the fourth layer does not contact the EMC.

* * * * *